(12) United States Patent
Park et al.

(10) Patent No.: US 8,110,905 B2
(45) Date of Patent: Feb. 7, 2012

(54) INTEGRATED CIRCUIT PACKAGING SYSTEM WITH LEADFRAME INTERPOSER AND METHOD OF MANUFACTURE THEREOF

(75) Inventors: DongSam Park, Seongnam-si (KR); YoungSik Cho, Hwasung-si (KR); Sang-Ho Lee, Yeoju (KR)

(73) Assignee: Stats Chippac Ltd., Singapore (SG)

( * ) Notice: Subject to any disclaimer, the term of this patent is extended or adjusted under 35 U.S.C. 154(b) by 390 days.

(21) Appl. No.: 12/328,717

(22) Filed: Dec. 4, 2008

(65) Prior Publication Data

US 2009/0152547 A1 Jun. 18, 2009

Related U.S. Application Data

(60) Provisional application No. 61/014,438, filed on Dec. 17, 2007.

(51) Int. Cl.
*H01L 23/495* (2006.01)
*H01L 21/58* (2006.01)
*H01L 21/60* (2006.01)

(52) U.S. Cl. ........ 257/673; 257/690; 257/738; 257/777; 257/E23.052; 257/E23.054; 257/E23.07; 257/E21.499; 257/E21.506; 257/E21.522; 257/48; 438/109; 438/123; 438/15

(58) Field of Classification Search .................... 257/48, 257/673, 737, 738, 777, 780, E23.052, E23.056, 257/E23.169, E21.499, E21.502, E21.503, 257/E21.522, 686, 690, E23.053, E23.054, 257/E23.07, E21.506; 438/109, 123, 15
See application file for complete search history.

(56) References Cited

U.S. PATENT DOCUMENTS

| | | | | |
|---|---|---|---|---|
| 5,332,864 A * | 7/1994 | Liang et al. | ................... | 174/523 |
| 5,744,383 A * | 4/1998 | Fritz | .............................. | 438/111 |
| 5,866,939 A | 2/1999 | Shin et al. | | |
| 5,929,627 A * | 7/1999 | MacPherson et al. | ... | 324/763.01 |
| 7,053,477 B2 | 5/2006 | Karnezos et al. | | |
| 7,364,945 B2 * | 4/2008 | Shim et al. | ..................... | 438/109 |
| 7,435,619 B2 * | 10/2008 | Shim et al. | .................... | 438/107 |
| 7,535,086 B2 * | 5/2009 | Merilo et al. | ................. | 257/676 |
| 7,718,472 B2 * | 5/2010 | Merilo et al. | ................. | 438/109 |
| 7,795,710 B2 * | 9/2010 | Islam et al. | .................... | 257/666 |
| 7,820,480 B2 * | 10/2010 | Islam et al. | .................... | 438/107 |
| 7,832,097 B1 * | 11/2010 | Huemoeller et al. | ........... | 29/852 |
| 7,855,100 B2 * | 12/2010 | Shim et al. | .................... | 438/107 |
| 7,868,434 B2 * | 1/2011 | Merilo et al. | ................. | 257/676 |
| 7,872,340 B2 * | 1/2011 | Choi et al. | ................... | 257/686 |
| 2006/0151860 A1* | 7/2006 | Islam et al. | ................... | 257/676 |
| 2006/0220211 A1* | 10/2006 | Yamazaki et al. | ............ | 257/686 |
| 2006/0220256 A1* | 10/2006 | Shim et al. | .................... | 257/777 |
| 2007/0187826 A1* | 8/2007 | Shim et al. | .................... | 257/738 |
| 2007/0210443 A1* | 9/2007 | Merilo et al. | ................. | 257/704 |
| 2008/0001264 A1 | 1/2008 | Lange | | |
| 2008/0076206 A1* | 3/2008 | Islam et al. | .................... | 438/107 |
| 2008/0157319 A1 | 7/2008 | Ha et al. | | |
| 2008/0157325 A1* | 7/2008 | Chow et al. | ................... | 257/686 |

(Continued)

*Primary Examiner* — Mary Wilczewski
(74) *Attorney, Agent, or Firm* — Mikio Ishimaru

(57) ABSTRACT

A method of manufacture of an integrated circuit packaging system includes: forming a substrate; mounting a base integrated circuit on the substrate; forming a leadframe interposer, over the base integrated circuit, by: providing a metal sheet, mounting an integrated circuit die on the metal sheet, injecting a molded package body on the integrated circuit die and the metal sheet, and forming a ball pad, a bond finger, or a combination thereof from the metal sheet that is not protected by the molded package body; coupling a circuit package on the ball pad; and forming a component package on the substrate, the base integrated circuit, and the leadframe interposer.

20 Claims, 5 Drawing Sheets

U.S. PATENT DOCUMENTS

| | | |
|---|---|---|
| 2008/0179729 A1* | 7/2008 | Shim et al. .................... 257/686 |
| 2008/0211084 A1 | 9/2008 | Chow et al. |
| 2008/0258278 A1 | 10/2008 | Ramos et al. |
| 2009/0057864 A1* | 3/2009 | Choi et al. .................... 257/686 |
| 2009/0152547 A1* | 6/2009 | Park et al. ........................ 257/48 |
| 2009/0166835 A1* | 7/2009 | Yang et al. .................... 257/686 |
| 2010/0176497 A1* | 7/2010 | Merilo et al. ................. 257/668 |
| 2011/0018084 A1* | 1/2011 | Shim et al. .................... 257/434 |

\* cited by examiner

INTEGRATED CIRCUIT PACKAGING SYSTEM WITH LEADFRAME INTERPOSER AND METHOD OF MANUFACTURE THEREOF

CROSS-REFERENCE TO RELATED APPLICATION(S)

This application claims the benefit of U.S. Provisional Patent Application Ser. No. 61/014,438 filed Dec. 17, 2007, and the subject matter thereof is incorporated herein by reference thereto.

TECHNICAL FIELD

The present invention relates generally to an integrated circuit packaging system, and more particularly to a system for forming three dimensional stacked packages with an interposer.

BACKGROUND ART

Integrated circuits are used in many portable electronic products, such as cell phones, portable computers, voice recorders, etc. They are also used in many larger electronic systems, such as cars, planes, industrial control systems, and the like. Across virtually all applications, there continues to be demand for reducing the size and increasing performance of the devices. The intense demand is now at a peak in portable electronics that have become so ubiquitous and are frequently shrinking in size.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance and smaller component size.

Some of the functions that are required to support the new applications are based on different technologies. As an example, high capacity memory may be built in a different technology than a high speed processor. This situation prevents them from being fabricated on the same silicon wafer, but the different technologies can be packaged together to deliver highly space efficient components.

Drawbacks of conventional designs include a relatively large footprint of the package on the mounting surface of motherboard. The footprint reflects what is typically measured as the maximum dimension of the package, namely, the x-y dimension. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect and large footprint top packages have plagued previous stacked package or package on package designs.

Thus, a need still remains for an integrated circuit packaging system with interposer that can support high input/output count devices and high quality stacked package designs. In view of the ever-increasing demand for more functions in a smaller space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system includes: forming a substrate; mounting a base integrated circuit on the substrate; forming a leadframe interposer, over the base integrated circuit, by: providing a metal sheet, mounting an integrated circuit die on the metal sheet, injecting a molded package body on the integrated circuit die and the metal sheet, and forming a ball pad, a bond finger, or a combination thereof from the metal sheet that is not protected by the molded package body; coupling a circuit package on the ball pad; and forming a component package on the substrate, the base integrated circuit, and the leadframe interposer.

The present invention provides an integrated circuit packaging system, including: a substrate; a base integrated circuit mounted on the substrate; a leadframe interposer, over the base integrated circuit, includes: ball pads, bond fingers, or a combination thereof an integrated circuit die mounted over the ball pads, and a molded package body on the integrated circuit die, the ball pads, and the bond fingers; a circuit package coupled on the ball pads; and a component package on the substrate, the base integrated circuit, and the leadframe interposer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
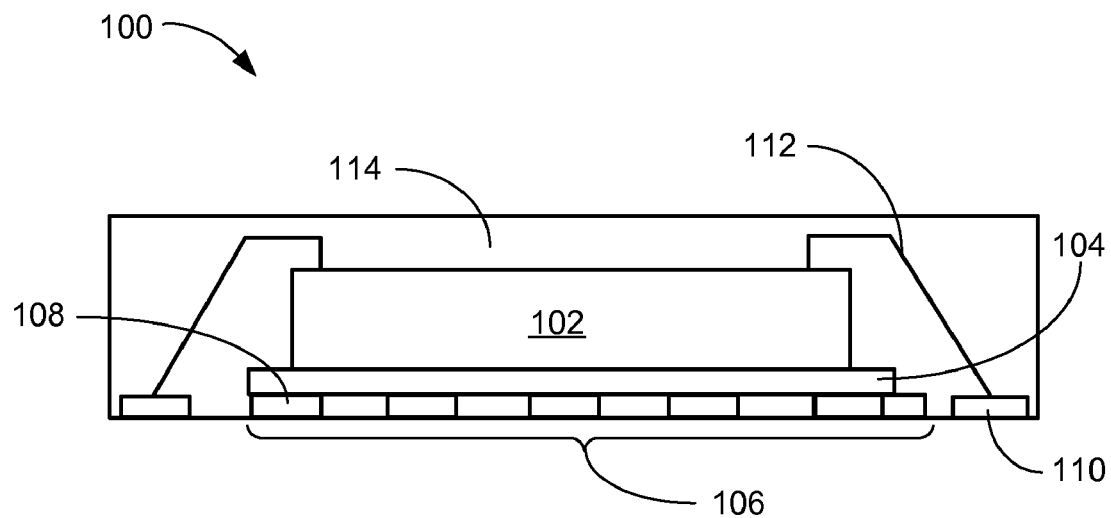
FIG. 1 is a cross-sectional view of an integrated circuit packaging system with leadframe interposer, as viewed along a section line 1-1 of FIG. 3, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 3:
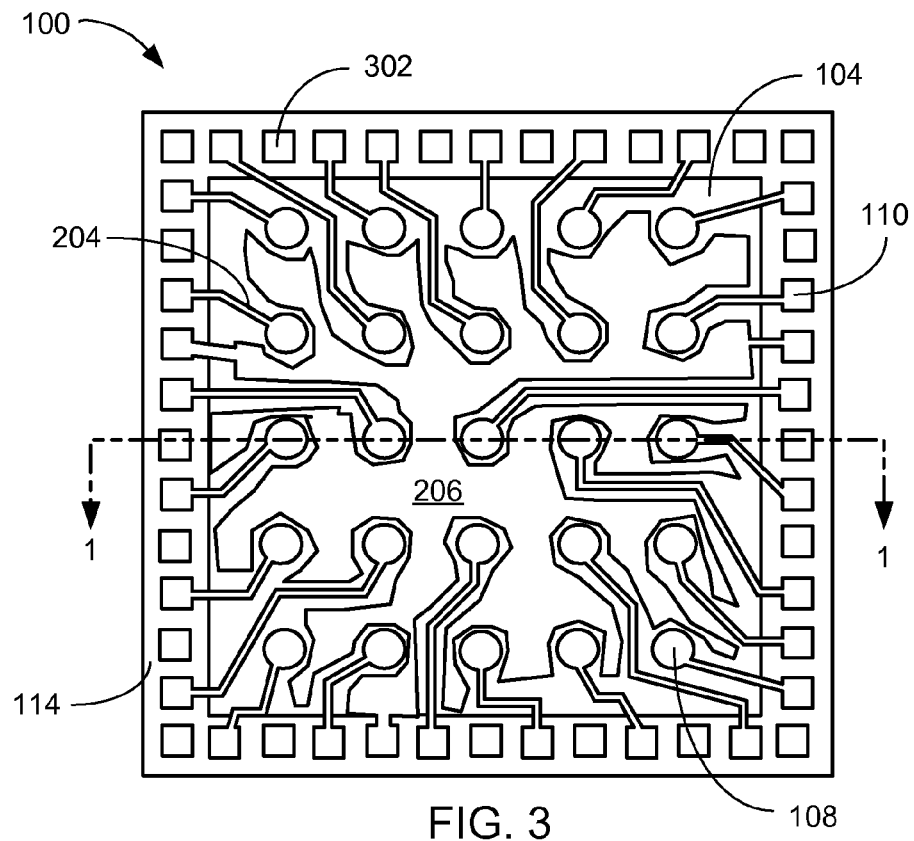
FIG. 3 is a top view of the integrated circuit packaging system in the first embodiment of the present invention.

Referring now to FIG. 1, therein is shown a cross-sectional view of an integrated circuit packaging system 100 with leadframe interposer, as viewed along the section line 1-1 of FIG. 3, in a first embodiment of the present invention. The cross-sectional view of the integrated circuit packaging system 100 depicts an integrated circuit die 102 mounted by an adhesive 104, such as a die attach material, on an array 106 of ball pads 108. Bond fingers 110 may be located around the periphery of the array 106. Electrical interconnects 112, such as bond wires, may couple the integrated circuit die 102 to the bond fingers 110. A molded package body 114 may be formed by injecting an epoxy molding compound on the integrated circuit die 102, the adhesive 104, the ball pads 108, the bond fingers 110 and the electrical interconnects 112.

It has been discovered that the integrated circuit packaging system 100 may provide a method for forming a 3-D stacked integrated circuit package having less vertical height than is customary. This is essential for reducing the over all vertical height of the end application. Not shown.

The number and position of the ball pads 108 in the array 106 is an example only and the actual number may differ. The position and number of the bond fingers 110 is also an example. There could be more than a single row of the bond fingers 110 positioned around the array 106.

Figure 2:
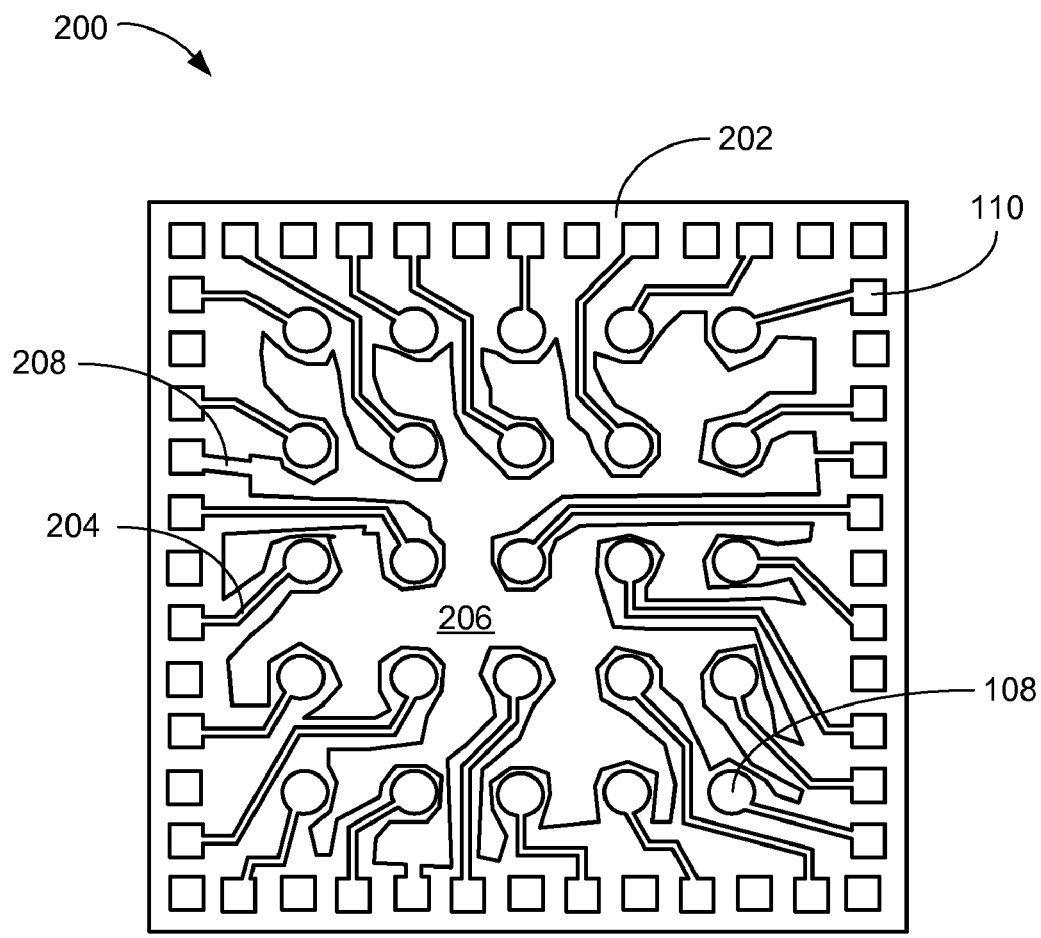
FIG. 2 is a top view of a leadframe interposer base in the first embodiment of the present invention.

Referring now to FIG. 2, therein is shown a top view of a leadframe interposer base 200 in the first embodiment of the present invention. The top view of the leadframe interposer base 200 depicts a metal sheet 202, such as a copper sheet, that may have been embossed with a pattern that may provide the bond fingers 110 around the periphery of the metal sheet 202. The ball pads 108 may be patterned in the central area of the metal sheet 202. The embossing process may be a stamping process, an etching process, or a combination thereof A signal trace 204 may couple the ball pads 108 to the bond fingers 110. There may be a one-to-one correspondence between the ball pads 108 and the bond fingers 110 that are coupled by the signal traces 204. An isolation shield 206 may be formed within the central area of the metal sheet 202. The isolation shield 206 may be coupled to more than one of the bond fingers 110 by a shorting bridge 208, such as a thicker trace than the signal trace 204.

The isolation shield 206 may serve to control the impedance of the signal traces 204 that are used for high speed signaling. It may have the additional benefit of acting as a heat spreader when the integrated circuit die 102 of FIG. 1 is operating. The isolation shield 206 may also serve to reduce the electro magnetic interference between the signal traces 204.

The pattern of the ball pads 108, the bond fingers 110, and the signal traces 204 is for an example only and may differ in actual implementations. The shape and indeed the presence of the isolation shield 206 is an example only and may differ.

Referring now to FIG. 3, therein is shown a top view of the integrated circuit packaging system 100 in the first embodiment of the present invention. The top view of the integrated circuit packaging system 100 depicts the molded package body 114 encasing the bond fingers 110 and the signal traces 204. The adhesive 104 may prevent the ball pads 108 and the isolation shield 206 from being encased by the molded package body 114. This is an example only and the molded package body may encase the signal traces 204, the adhesive 104, or the isolation shield 206. The signal traces 204 may be half etched, so that the molded package body 114 does intentionally cover them. The ball pads 108 and the bond fingers 110 will remain exposed for further electrical connection.

The section line 1-1 displays the position and direction of view of FIG. 1 and subsequent views. The number and position of the ball pads 108 and the bond fingers 110 is an example only and the actual number and position may vary. A test pad 302 that is not connected to the signal trace 204 may be formed in the periphery of the integrated circuit packaging system 100 and arranged between the bond fingers 110. The test pad 302 may be coupled to the integrated circuit die 102 of FIG. 1 to be made available for other internal connections.

Figure 4:
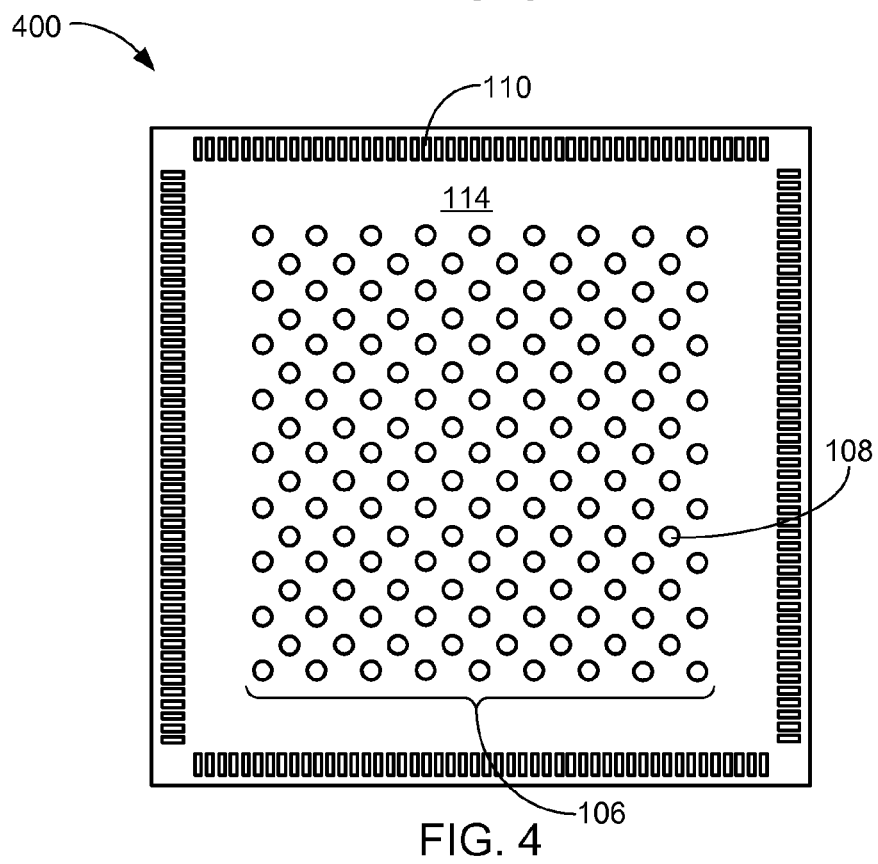
FIG. 4 is a top view of a leadframe interposer having an increased number of interconnects.

Referring now to FIG. 4, therein is shown a top view of a leadframe interposer 400 having an increased number of interconnects. The top view of the leadframe interposer 400 depicts the molded package body 114 having encased all of the elements except the bond fingers 110 and the ball pads 108. While the bond fingers 110 are shown in a single row around the periphery of the leadframe interposer 400, this is an example only and other configurations are likely. The array 106 of the ball pads 108 may be positioned in a staggered array as shown or in an abreast array as depicted in FIG. 3. Any pattern of the ball pads 108 may be possible.

Figure 5:
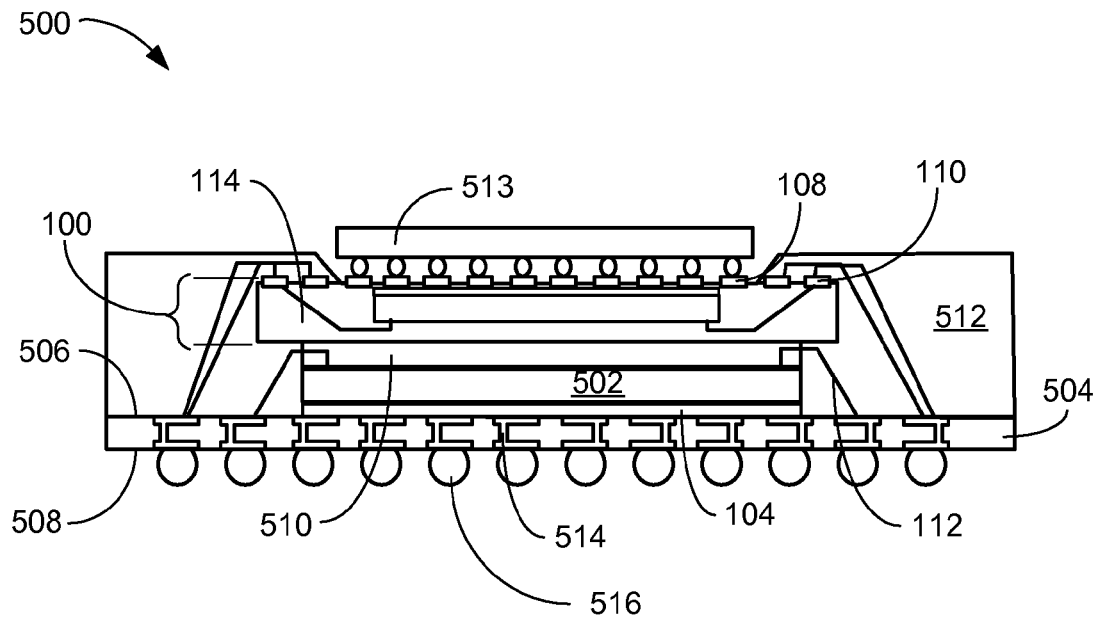
FIG. 5 is a cross-sectional view of a first application, substantially similar to section line 1-1 of FIG. 3, of the integrated circuit packaging system.

Referring now to FIG. 5, therein is shown a cross-sectional view of a first application 500 substantially similar to section line 1-1 of FIG. 3 of the integrated circuit packaging system. The cross-sectional view of the first application 500 depicts a base integrated circuit 502, such as a wire bond type of integrated circuit or a flip chip integrated circuit, mounted on a substrate 504 by the adhesive 104. The substrate 504 may have a component side 506 and a system side 508. The base integrated circuit 502 may be coupled to the component side 506 by the electrical interconnects 112. An integrated circuit spacer 510 may be positioned on the base integrated circuit 502 and the electrical interconnects 112.

The integrated circuit packaging system 100 may be mounted on the integrated circuit spacer 510 with the molded package body 114 positioned toward the base integrated circuit 502. The bond fingers 110 may be coupled to the component side 506 by the electrical interconnects 112. A component package 512 may be formed on the component side 506, the base integrated circuit 502, the electrical interconnects 112, the integrated circuit spacer 510, and the bond fingers 110. The ball pads 108 may be left exposed for later connection to a circuit package 513, such as an integrated circuit package, discrete components, or a combination thereof.

The component side 506 may be coupled to the system side 508 by contact vias 514. System interconnects 516, such as solder balls, solder bumps, solder columns, or stud bumps, may be coupled to the contact vias 514 on the system side 508. An electrical connection may be formed between the system interconnects 516, the base integrated circuit 502 the integrated circuit die 102, the ball pads 108, or a combination thereof.

Figure 6:
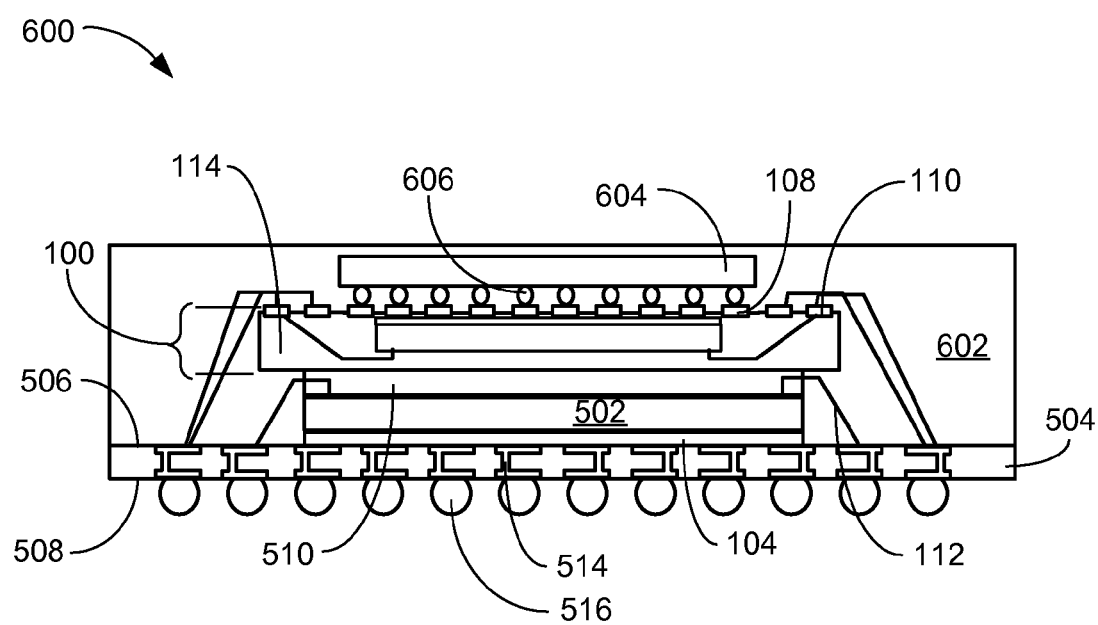
FIG. 6 is a cross-sectional view of a second application, substantially similar to section line 1-1 of FIG. 3, of the integrated circuit packaging system.

Referring now to FIG. 6, therein is shown a cross-sectional view of a second application 600, substantially similar to section line 1-1 of FIG. 3, of the integrated circuit packaging system. The cross-sectional view of the second application 600 depicts the base integrated circuit 502, such as a wire bond type of integrated circuit or a flip chip integrated circuit, mounted on the substrate 504 by the adhesive 104. The substrate 504 may have the component side 506 and the system side 508. The base integrated circuit 502 may be coupled to the component side 506 by the electrical interconnects 112. The integrated circuit spacer 510 may be positioned on the base integrated circuit 502 and the electrical interconnects 112.

The integrated circuit packaging system 100 may be mounted on the integrated circuit spacer 510 with the molded package body 114 positioned toward the base integrated circuit 502. The bond fingers 110 may be coupled to the component side 506 by the electrical interconnects 112. A package body 602 may be formed on the component side 506, the base integrated circuit 502, the electrical interconnects 112, the integrated circuit spacer 510, the bond fingers 110, and an internal component 604, such as an integrated circuit package, discrete components, or a combination thereof. The internal component 604 may be mounted on the ball pads 108 by chip interconnects 606, such as solder balls, solder bumps, solder columns, or stud bumps.

The component side 506 may be coupled to the system side 508 by the contact vias 514. The system interconnects 516, such as solder balls, solder bumps, solder columns, or stud bumps, may be coupled to the contact vias 514 on the system side 508. An electrical connection may be formed between the system interconnects 516, the base integrated circuit 502 the integrated circuit die 102, the internal component 604, or a combination thereof.

Figure 7:
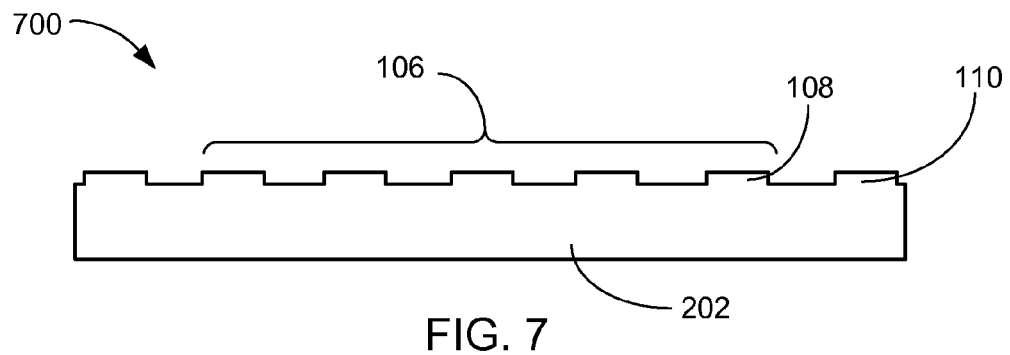
FIG. 7 is a cross-sectional view of a leadframe interposer base, substantially similar to section line 1-1 of FIG. 3, in a leadframe preparation phase of manufacturing.

Referring now to FIG. 7, therein is shown a cross-sectional view of a leadframe interposer base 700, substantially similar to section line 1-1 of FIG. 3, in a leadframe preparation phase of manufacturing. The cross-sectional view of the leadframe interposer base 700 depicts the metal sheet having the embossed pattern of the array 106 of the ball pads 108 and the bond fingers 110. The embossed pattern may be formed on the metal sheet by pressing, etching, laser trimming, or a combination thereof.

The leadframe interposer base 700 may have other structures formed on the surface of the metal sheet 202. Structures such as the isolation shield 206 of FIG. 2, the signal traces 204 of FIG. 2, the shorting bridge 208 of FIG. 2, or a combination thereof may be present. The structure shown is a simplified example only.

Figure 8:
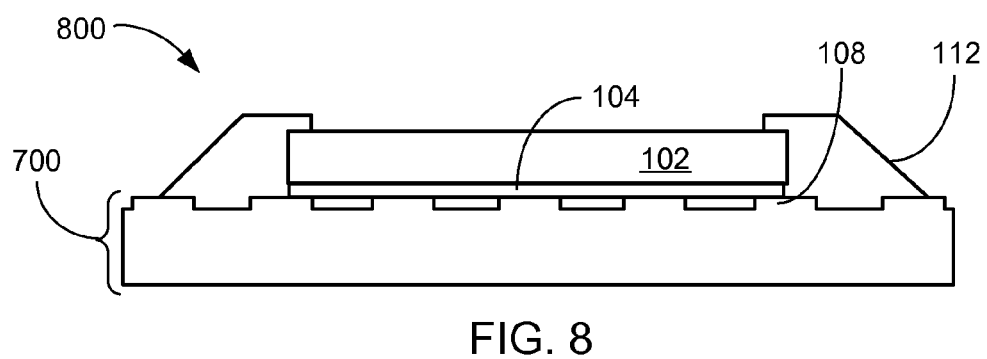
FIG. 8 is a cross-sectional view of a first leadframe interposer assembly substantially similar to section line 1-1 of FIG. 3.

Referring now to FIG. 8, therein is shown a cross-sectional view of a first leadframe interposer assembly 800 substantially similar to section line 1-1 of FIG. 3. The cross-sectional view of the first leadframe interposer assembly 800 depicts the integrated circuit die 102 mounted by the adhesive 104 on the ball pads 108 of the leadframe interposer base 700. The electrical interconnects 112 may couple the integrated circuit die 102 to the bond fingers 110.

Figure 9:
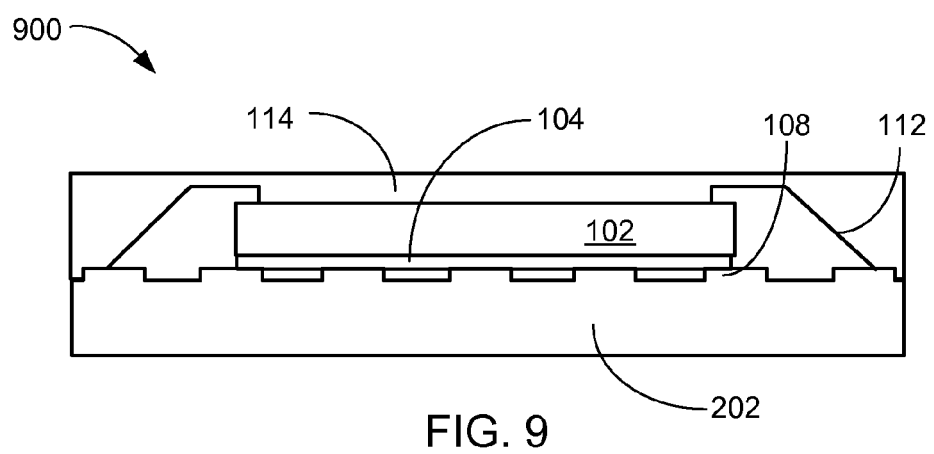
FIG. 9 is a cross-sectional view of a second leadframe interposer assembly substantially similar to section line 1-1 of FIG. 3.

Referring now to FIG. 9, therein is shown a cross-sectional view of a second leadframe interposer assembly 900 substantially similar to section line 1-1 of FIG. 3. The cross-sectional view of the second leadframe interposer assembly 900 depicts the molded package body 114 formed on the integrated circuit die 102, the adhesive 104, the ball pads 108, the bond fingers 110, and the electrical interconnects 112.

Once the molded package body 114 is in place, the second leadframe assembly 900 may be subjected to an etching process in order to remove the excess material form the metal sheet 202. The structure that remains after the etching process is the integrated circuit packaging system 100 of FIG. 1.

Figure 10:
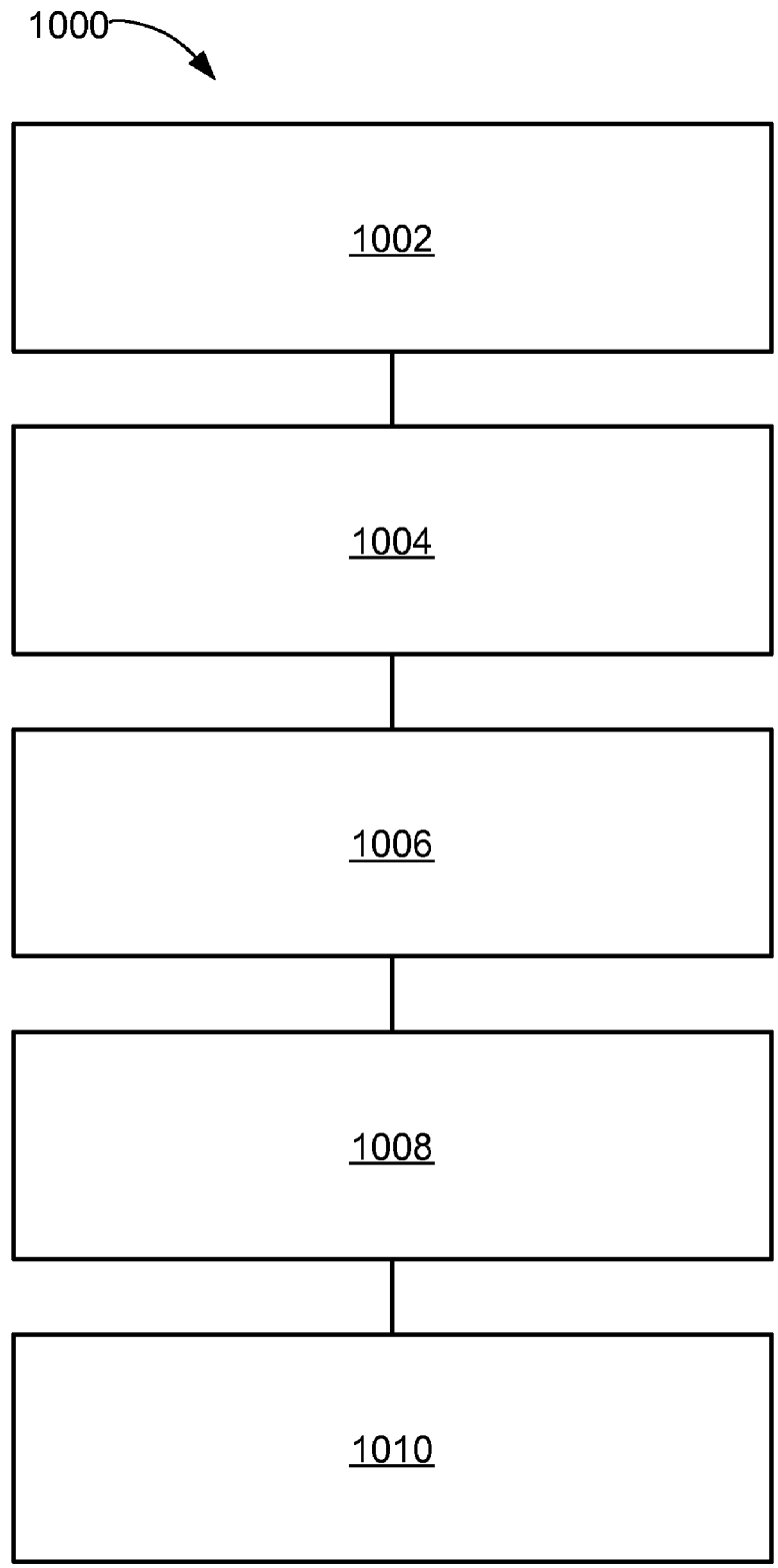
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in a further embodiment of the present invention. The method 1000 includes forming a substrate in a block 1002; mounting a base integrated circuit on the substrate in a block 1004; forming a leadframe interposer, over the base integrated circuit, by: providing a metal sheet, mounting an integrated circuit die on the metal sheet, injecting a molded package body on the integrated circuit die and the metal sheet, and forming a ball pad, a bond finger, or a combination thereof from the metal sheet that is not protected by the molded package body in a block 1006; coupling a circuit package on the ball pad in a block 1008; and forming a component package on the substrate, the base integrated circuit, and the leadframe interposer in a block 1010.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a substrate;
    mounting a base integrated circuit on the substrate;
    forming a leadframe interposer, over the base integrated circuit, by:
        providing a metal sheet,
        mounting an integrated circuit die on the metal sheet,
        injecting a molded package body on the integrated circuit die and the metal sheet, and
        forming a ball pad, a bond finger, and a test pad from the metal sheet that is not protected by the molded package body, the test pad arranged between a number of bond fingers;
    coupling a circuit package on the ball pad; and
    forming a component package on the substrate, the base integrated circuit, and the leadframe interposer.

2. The method as claimed in claim 1 wherein forming the ball pad, and the bond finger includes forming a signal trace between the ball pad and the bond finger.

3. The method as claimed in claim 1 further comprising mounting an integrated circuit spacer between the base integrated circuit and the molded package body of the leadframe interposer.

4. The method as claimed in claim 1 further comprising coupling an electrical interconnect between the base integrated circuit, the bond finger, the substrate, or a combination thereof.

5. The method as claimed in claim 1 further comprising forming an isolation shield between the ball pad and the bond finger.

6. A method of manufacture of an integrated circuit packaging system comprising:
    forming a substrate including forming a contact via in the substrate;
    mounting a base integrated circuit on the substrate including applying an adhesive between the base integrated circuit and the substrate;
    forming a leadframe interposer, over the base integrated circuit, by:
        embossing a metal sheet including foming an array by pressing, etching, laser trimming, or a combination thereof,
        mounting an integrated circuit die on the metal sheet including coupling a test pad to the integrated circuit die,
        injecting a molded package body on the integrated circuit die and the metal sheet including injecting an epoxy molding compound, and
        etching a ball pad, a bond finger, and a test pad from the metal sheet that is not protected by the molded package body including forming a one-on-one connection between the ball pad and the bond finger, the test pad arranged between a number of bond fingers:
    coupling a circuit package on the ball pad including coupling an integrated circuit, discrete components, or a combination thereof; and
    forming a component package on the substrate, the base integrated circuit, and the leadframe interposer.

7. The method as claimed in claim 6 wherein etching the ball pad and the bond finger includes etching a signal trace between the ball pad and the bond finger including controlling an impedance by placing an isolation shield near the signal trace.

8. The method as claimed in claim 6 further comprising mounting an integrated circuit spacer between the base integrated circuit and the molded package body of the leadframe interposer including providing an electrical interconnect in the integrated circuit spacer.

9. The method as claimed in claim 6 further comprising coupling an electrical interconnect between the base integrated circuit, the bond finger, the substrate, or a combination thereof including coupling a signal between the base integrated circuit, the integrated circuit die, the circuit package, or a combination thereof.

10. The method as claimed in claim 6 further comprising embossing an isolation shield between the ball pad and the bond finger including coupling a shorting bridge between the isolation shield and the test pad.

11. An integrated circuit packaging system comprising:
    a substrate;
    a base integrated circuit mounted on the substrate;
    a leadframe interposer, over the base integrated circuit, includes:
        a ball pad, a bond finger, and a test pad, the test pad arranged between a number of bond fingers,
        an integrated circuit die mounted over the ball pad, and
        a molded package body on the integrated circuit die, the ball pad, and the bond finger;
    a circuit package coupled on the ball pad; and
    a component package on the substrate, the base integrated circuit, and the leadframe interposer.

12. The system as claimed in claim 11 wherein the ball pad and the bond finger includes a signal trace between the ball pad and the bond finger.

13. The system as claimed in claim 11 further comprising an integrated circuit spacer between the base integrated circuit and the molded package body of the leadframe interposer.

14. The system as claimed in claim 11 further comprising an electrical interconnect between the base integrated circuit, the bond finger, the substrate, or a combination thereof.

15. The system as claimed in claim 11 further comprising an isolation shield between the ball pad and the bond finger.

16. The system as claimed in claim 11 further comprising:
    a contact via in the substrate;
    an adhesive between the base integrated circuit and the substrate; and
    wherein:
        the test pad is coupled to the integrated circuit die.

17. The system as claimed in claim 16 wherein the ball pad and the bond finger includes a signal trace between the ball pad and the bond finger with an isolation shield near the signal trace.

18. The system as claimed in claim 16 further comprising an integrated circuit spacer between the base integrated circuit and the molded package body of the leadframe interposer includes an electrical interconnect in the integrated circuit spacer.

19. The system as claimed in claim 16 further comprising an electrical interconnect between the base integrated circuit, the bond finger, the substrate, or a combination thereof includes a signal coupled by a system interconnect to the base integrated circuit, the integrated circuit die, the circuit package, or the combination thereof.

20. The system as claimed in claim 16 further comprising an isolation shield between the ball pad and the bond finger includes a shorting bridge between the isolation shield and the test pad.

* * * * *

UNITED STATES PATENT AND TRADEMARK OFFICE
CERTIFICATE OF CORRECTION

PATENT NO.        : 8,110,905 B2                                    Page 1 of 1
APPLICATION NO.   : 12/328717
DATED             : February 7, 2012
INVENTOR(S)       : Park et al.

It is certified that error appears in the above-identified patent and that said Letters Patent is hereby corrected as shown below:

Column 7:
claim 6, line 57, delete "including foming an array" and insert therefor --including forming an array--

Column 8:
claim 6, line 3, delete "number of bond fingers:" and insert therefor --number of bond fingers;--

Signed and Sealed this
Twenty-fifth Day of September, 2012

David J. Kappos
*Director of the United States Patent and Trademark Office*